(12) United States Patent
Dezelah et al.

(10) Patent No.: US 11,574,813 B2  
(45) Date of Patent: Feb. 7, 2023

(54) ATOMIC LAYER ETCHING

(71) Applicant: ASM IP Holding B.V., Almere (NL)

(72) Inventors: Charles Dezelah, Helsinki (FI); Varun Sharma, Helsinki (FI)

(73) Assignee: ASM IP HOLDING B.V., Almere (NL)

( * ) Notice: Subject to any disclaimer, the term of this patent is extended or adjusted under 35 U.S.C. 154(b) by 0 days.

(21) Appl. No.: 17/114,264

(22) Filed: Dec. 7, 2020

(65) Prior Publication Data

US 2021/0175088 A1  Jun. 10, 2021

Related U.S. Application Data

(60) Provisional application No. 62/946,110, filed on Dec. 10, 2019.

(51) Int. Cl.  
*H01L 21/3065* (2006.01)  
*C23F 1/32* (2006.01)  
*H01J 37/32* (2006.01)

(52) U.S. Cl.  
CPC .......... *H01L 21/30655* (2013.01); *C23F 1/32* (2013.01); *H01J 37/32009* (2013.01)

(58) Field of Classification Search  
CPC .............................. H01L 21/30655; C23F 1/32  
See application file for complete search history.

(56) References Cited

U.S. PATENT DOCUMENTS

| | | | |
|---|---|---|---|
| 7,537,662 B2 | 5/2009 | Soininen et al. | |
| 7,911,001 B2 | 3/2011 | Lee et al. | |
| 8,632,687 B2 | 1/2014 | Auth et al. | |
| 8,869,742 B2 | 10/2014 | Dhindsa et al. | |
| 9,132,436 B2 | 9/2015 | Liang et al. | |
| 9,184,028 B2 | 11/2015 | Dhindsa et al. | |

(Continued)

FOREIGN PATENT DOCUMENTS

| | | |
|---|---|---|
| JP | H0387026 | 4/1991 |
| JP | H05206088 | 8/1993 |

(Continued)

OTHER PUBLICATIONS

Wikipedia, The Free Encylopedia; "Bis(trimethylsilyl)amine" via https://web.archive.org/web/20170318190951/https://en.wikipedia.org/wiki/Bis(trimethylsilyl)amine ; pp. 1-4 (Year: 2016).*

(Continued)

*Primary Examiner* — Binh X Tran  
(74) *Attorney, Agent, or Firm* — Knobbe, Martens, Olson & Bear LLP

(57) ABSTRACT

Atomic layer etching (ALE) processes are disclosed. In some embodiments, the methods comprise at least one etch cycle in which a substrate comprising a metal, metal oxide, metal nitride or metal oxynitride layer is contacted with an etch reactant comprising an vapor-phase N-substituted derivative of amine compound. In some embodiments the etch reactant reacts with the substrate surface to form volatile species including metal atoms from the substrate surface. In some embodiments a metal or metal nitride surface is oxidized as part of the ALE cycle. In some embodiments a substrate surface is contacted with a halide as part of the ALE cycle. In some embodiments a substrate surface is contacted with a plasma reactant as part of the ALE cycle.

14 Claims, 3 Drawing Sheets

(56) References Cited

U.S. PATENT DOCUMENTS

| | | | |
|---|---|---|---|
| 9,257,638 B2 | 2/2016 | Tan et al. | |
| 9,390,940 B2 | 7/2016 | Anthis et al. | |
| 9,396,956 B1 | 7/2016 | Fukazawa | |
| 9,425,041 B2 | 8/2016 | Berry et al. | |
| 9,637,823 B2 | 5/2017 | Knoops et al. | |
| 9,716,012 B2 | 7/2017 | Thompson et al. | |
| 9,735,024 B2 | 8/2017 | Zaitsu | |
| 10,056,264 B2 | 8/2018 | Yang et al. | |
| 10,273,584 B2 | 4/2019 | Blomberg et al. | |
| 10,280,519 B2 | 5/2019 | Blomberg et al. | |
| 10,283,319 B2 | 5/2019 | Blomberg et al. | |
| 2002/0160125 A1 | 10/2002 | Johnson et al. | |
| 2004/0216668 A1 | 11/2004 | Lindfors et al. | |
| 2005/0103265 A1 | 5/2005 | Gianoulakis et al. | |
| 2006/0197881 A1* | 9/2006 | Kang | H01L 27/3274 349/38 |
| 2006/0207504 A1 | 9/2006 | Hasebe et al. | |
| 2006/0249751 A1* | 11/2006 | de Fresart | H01L 29/7835 257/E29.268 |
| 2008/0318417 A1 | 12/2008 | Shinriki et al. | |
| 2009/0088547 A1* | 4/2009 | Schamschurin | C08G 77/06 528/14 |
| 2009/0266296 A1 | 10/2009 | Tachibana et al. | |
| 2011/0216390 A1* | 9/2011 | Tong | G02B 27/48 359/279 |
| 2013/0312663 A1 | 11/2013 | Khosla et al. | |
| 2014/0004464 A1* | 1/2014 | Christianson | G03F 7/0397 430/311 |
| 2014/0261733 A1 | 9/2014 | Wu et al. | |
| 2014/0273492 A1* | 9/2014 | Anthis | C23F 1/12 438/720 |
| 2015/0218695 A1 | 8/2015 | Odedra | |
| 2016/0090650 A1 | 3/2016 | Qian et al. | |
| 2016/0208382 A1 | 7/2016 | Takahashi et al. | |
| 2016/0293398 A1 | 10/2016 | Danek et al. | |
| 2016/0307764 A1 | 10/2016 | Gupta et al. | |
| 2016/0308112 A1 | 10/2016 | Tan et al. | |
| 2016/0329221 A1 | 11/2016 | Berry et al. | |
| 2016/0358782 A1 | 12/2016 | Yang et al. | |
| 2017/0081345 A1* | 3/2017 | Yaghi | C01B 3/0015 |
| 2017/0190983 A1* | 7/2017 | Soriano | B01J 31/1666 |
| 2018/0174826 A1 | 6/2018 | Raaijmakers et al. | |
| 2019/0112716 A1* | 4/2019 | Winter | C23F 1/12 |
| 2019/0309417 A1* | 10/2019 | Ahlf | C23C 16/401 |
| 2020/0313093 A1* | 10/2020 | Padture | H01L 51/4213 |
| 2020/0368690 A1* | 11/2020 | Yandrasits | B01D 67/0088 |
| 2021/0020468 A1 | 1/2021 | Blomberg et al. | |
| 2021/0020469 A1 | 1/2021 | Blomberg et al. | |
| 2022/0037132 A1* | 2/2022 | Yu | C23C 16/4405 |

FOREIGN PATENT DOCUMENTS

| | | |
|---|---|---|
| JP | H08176851 | 7/1996 |
| JP | H10150024 | 6/1998 |
| JP | 2004-063633 | 2/2004 |
| JP | 2015-032597 | 2/2015 |
| JP | 2015-533029 | 11/2015 |
| KR | 10-1997-0009860 | 3/1997 |
| KR | 10-0707983 | 4/2007 |
| KR | 10-2011-0098355 | 9/2011 |
| KR | 10-1465338 | 11/2014 |
| TW | 201525173 | 7/2015 |
| TW | 201608662 | 3/2016 |
| WO | WO 2015/160412 | 10/2015 |
| WO | WO 2016/100873 | 6/2016 |
| WO | WO 2016/160778 | 10/2016 |
| WO | WO 2016/172740 | 10/2016 |
| WO | WO 2017/099718 | 6/2017 |
| WO | WO 2017/205658 | 11/2017 |
| WO | WO 2017/213842 | 12/2017 |
| WO | WO 2018/106955 | 6/2018 |

OTHER PUBLICATIONS

Wikipedia, "Chelation" via https://en.wikipedia.org/wiki/Chelation ; pp. 1-6 (Year: 2022).*
Wikipedia, "Alkyl" via https://en.wikipedia.org/wiki/Alkyl ; pp. 1-6 (Year: 2022).*
"Chemicals Used in Chip Fabrication," GAPS Guidelines GAP.17.1.1.B, Global Asset Protection Services LLC, 2015, pp. 1-4.
"Inorganic Analysis," Analyst, 1921,46, pp. 157-161.
"Safetygram #25", Air Products and Chemicals, Inc., 2004 in 8 pages.
"SO3 Gas-Phase Cleaning Process," Final Report, ANON Inc., San Jose, California, 1999, in 19 pages.
"Insights for Electronics Manufacturing", Solid State Technology, Jul. 2016, vol. 59, No. 5, pp. 1-52.
"Xenon Difluoride (XeF2)," Versum Materials, LLC, 2016, in 2 pages.
Barton et al., "The Dissociation of Sulfur Monochloride Vapor," J. Am. Chem. Soc., Feb. 1935, vol. 57 (2), pp. 307-310.
Brandão et al., "Synthesis, Characterization and use of Nb2O5 based Catalysts in Producing Biofuels by Transesterification, Esterification and Pyrolysis," J. Braz. Chem. Soc., 2009, vol. 20, No. 5, pp. 954-966.
Bock et al., "Unstable Intermediates in the Gaseous Phase: The Thermal Decomposition of Acyl Chlorides RCOC1," Angew. Chem. Int. Ed. Engl., 16, (1977) No. 2, pp. 105-107.
Chaiken et al., "Rate of Sublimation of Ammonium Halides," The Journal of Chemical Physics 37, 2311 (1962), in 9 pages.
Chalker, P.R., "Photochemical Atomic Layer Deposition and Etching," Surface & Coatings Technology, 291, (2016), pp. 258-263.
Coman et al., "NbF5—AlF3 Catalysts: Design, Synthesis, and Application in Lactic Acid Synthesis from Cellulose", ACS Catal., 2015, 5 (5), pp. 3013-3026.
Dumont et al., "Competition Between Al2O3 Atomic Layer Etching and AlF3 Atomic Layer Deposition Using Sequential Exposures of Trimethylaluminum and Hydrogen Fluoride." The Journal of Chemical Physics, 146, (2017), pp. 052819-1-052819-10.
Dumont et al., "Thermal Atomic Layer Etching of SiO2 by a "Conversion-Etch" Mechanism Using Sequential Reactions of Trimethylaluminum and Hydrogen Fluoride," ACS Appl. Mater. Interfaces, 2017, 9, pp. 10296-10307.
File History of U.S. Appl. No. 15/835,272, filed Dec. 7, 2017.
File History of U.S. Appl. No. 16/390,319, filed Apr. 22, 2019.
File History of U.S. Appl. No. 16/881,868, filed May 22, 2020.
File History of U.S. Appl. No. 15/835,212, filed Dec. 7, 2017.
File History of U.S. Appl. No. 16/390,385, filed Apr. 22, 2019.
File History of U.S. Appl. No. 16/881,718, filed May 22, 2020.
File History of U.S. Appl. No. 15/835,262, filed Dec. 7, 2017.
File History of U.S. Appl. No. 16/390,540, filed Apr. 22, 2019.
File History of U.S. Appl. No. 16/881,885, filed May 22, 2020.
File History of U.S. Appl. No. 16/930,800, filed Jul. 16, 2020.
File History of U.S. Appl. No. 16/930,867, filed Jul. 16, 2020.
Jackson et al., "Optimizing AlF3 Atomic Layer Deposition Using Trimethylaluminum and TaF5: Application to High Voltage Li-ion Battery Cathodes," Journal of Vacuum Science & Technology A 34, 2016, pp. 031503-1-031503-8.
Johnson et al., Thermal Atomic Layer Etching of Crystalline Aluminum Nitride Using Sequential, Selflimiting Hydrogen Fluoride and Sn(acac)2 Reactions and Enhancement by H2 and Ar.
Johnson et al., "WO3 and W Thermal Atomic Layer Etching Using "Conversion Fluorination" and "Oxidation-Conversion-Fluorination" Mechanisms", ACS Appl. Mater. Interfaces, 2017, 9, pp. 34435-34447.
Huardyiting Zhang, et al., "Atomic Layer Etching of 3D Structures in Silicon: Self-limiting and Nonideal Reactions," Journal of Vacuum Science & Technology A, 2017, pp. 031306-1-031306-15.
Kanarik et al., "Overview of Atomic Layer Etching in the Semiconductor Industry," Journal of Vacuum Science & Technology A: Vacuum, Surfaces, and Films 33, 2015, pp. 020802-1-020802-14.

(56) References Cited

OTHER PUBLICATIONS

Kastenmeier et al., "Remote Plasma Etching of Silicon Nitride and Silicon Dioxide Using NF3/02 Gas Mixtures," Journal of Vacuum Science & Technology A, 1998, pp. 2047-2056.

Kastenmeier et al., "Surface Etching Mechanism of Silicon Nitride in Fluorine and Nitric Oxide Containing Plasmas," Journal of Vacuum Science & Technology A, 2001, pp. 25-30.

Kepten, et al., "Studies of the Possible Reaction of WF6 with SiO2 and Si3N4 at Several Temperatures." J. Electrochem. Soc., vol. 139, No. 8, Aug. 1992, pp. 2331-2337.

Knapas et al., "Etching of Nb2O5 Thin Films by NbCl5", Chemical Vapor Deposition, 2009, vol. 15, pp. 269-273.

Kohli et al., "Methods for Removal of Particle Contaminants," Developments in Surface Contamination and Cleaning, vol. 3, 2011, in 259 pages.

Kuhle, Engelbert, "One Hundred Years of Sulfenic Acid Chemistry, 11b. Substitution and Cyclization Reactions of Sulfenyl Halides", Dec. 1971, pp. 617-638.

Lee et al., "Atomic Layer Etching of HfO2 Using Sequential, Self-Limiting Thermal Reactions with Sn(acac)2 and HF", ECS Journal of Solid State Science and Technology, 4 (6), 2015, pp. N5013-N5022.

Lee et al., "Atomic Layer Etching Al2O3 Using Sequential, Self-Limiting Thermal Reactions with Sn(acac)2 and Hydrogen Fluoride", ACS Nano, 9 (2), 2015, pp. 2061-2070.

Lee et al., "Selectivity in Atomic Layer Etching Using Sequential, Self-Limiting Thermal Reactions," ACS Nano 9, 2061, 2015, in 29 pages.

Lee et al., "Thermal Atomic Layer Etching of Titanium Nitride Using Sequential, Self-Limiting Reactions: Oxidation to TiO2 and Fluorination to Volatile TiF4", Chem. Mater., 2017, 29, pp. 8202-8210.

Lenher, Victor, "Some Properties on Selenium Oxychloride", Contribution from the Department of Chemistry, University of Wisconsin, May 26, 1922, pp. 1664-1667.

Luna, Adolfo E. Castro, "Vapor Pressure of WOCl4", J. Chem. Eng. Data, 1983, 28, p. 349.

Mcdonald et al., "Corrosion of Steel and Nickel Alloys in Neutral and Acidic Solutions of Thionyl Chloride and Sulfuryl Chloride," Journal of the Electrochemical Society, Jun. 1988, pp. 1313-1316.

Michalski et al., "A New Approach towards Organophosphorus Sulfenyl and Selenyl Halides, Phosphorus and Sulfur and the Related Elements", 30:1-2, Jan. 3, 2007, pp. 221-224.

Nieder-Vahrenholz, et al., "Die Oxidfluoride des Niobs und Tantals", Journal of Inorganic and General Chemistry, Zeitschrift für anorganische Chemie, vol. 544, 1, Jan. 1987, pp. 122-126.

Oehrlein, et al., "Atomic Layer Etching at the Tipping Point: An Overview", ECS Journal of Solid State Science and Technology, 4 (6), Mar. 27, 2015, pp. N5041-N5053.

Painter, Edgar Page, "The Chemistry and Toxicity of Selenium Compounds, with Special Reference to the Selenium Problem," Chem. Rev., Apr. 1941, 28 (2), pp. 179-213.

Pop et al., "New Group 11 Complexes with Metal-Selenium Bonds of Methyldiphenylphosphane Selenide: A Solid State, Slution and Theoretical Investigation," Dalton Trans., 2011, 40, pp. 12479-12490.

Rivillon et al., "Chlorination of Hydrogen-Terminated Silicon (111) Surfaces," J. Vac. Sci. Technol. A 23, Jul./Aug. 2005, pp. 1100-1106.

Shinoda et al., "Thermal Cyclic Etching of Silicon Nitride Using Formation and Desorption of Ammonium Fluorosilicate," Applied Physics Express 9, 2016, pp. 106201-1-106201-3.

Société chimique de France. Auteur du texte, "Bulletin de la Société chimique de Paris", L. Hachette; Masson, 1871, p. 47.

Sprenger et al., "Electron-enhanced atomic layer deposition of silicon thin films at room temperature", J. Vac. Sci. Technol. A 36(1), Jan./Feb. 2018, pp. 01A118-1-01A118-10.

Suresh B.S., et al., "A Study of the Reaction of Silicon Tetrahalides with Phosphorus Pentoxide and of Alkali Metal Fluorosilicates with Phosphorus Pentoxide and Sulphur Trioxide," Journal of Fluorine, 24, 1984, pp. 399-407.

Svistunova, I.V., "Boron Difluoride Acetylacetonate Sulfenyl (Selenyl) Halides," Russian Journal of General Chemistry, 2010, vol. 80, No. 12, pp. 2430-2437.

Vallée, et al., "Selective Deposition Process Combining PEALD and ALE ex: Ta2O5 and TiO2," Powerpoint presentation at the 2017 ALD Conference, in 53 pages.

* cited by examiner

ATOMIC LAYER ETCHING

REFERENCE TO RELATED APPLICATION

This application claims priority to U.S. Provisional Application No. 62/946,110, filed Dec. 10, 2019, which is incorporated by reference herein.

BACKGROUND

Field

The present application relates to etching processes, more particularly to atomic layer etching processes and etchants that can be used in atomic layer etching processes.

Background

Vapor deposition processes such as atomic layer deposition (ALD) are well-known. ALD processes typically utilize alternating and sequential pulses of vapor-phase reactants to deposit up to a monolayer of material in a controlled and highly-conformal manner. Thin films deposited by ALD are used in a wide variety of applications, such as in the formation of integrated circuits. Controlled removal of materials is also highly desirable. In contrast to ALD, atomic layer etching (ALE) utilizes sequential pulses of vapor phase reactants to remove material from a substrate in each reaction cycle. Existing ALE processes utilize compounds such as halides or plasma generated etchants, or do not provide complete removal of desired materials, such as parasitic metal or metal oxides on dielectric substrate surfaces.

SUMMARY

In some aspects, methods of etching a target material from a surface using vapor phase reactants are provided. In some embodiments, methods of etching a target material such as metal, metal oxide, or metal nitride from a substrate surface are provided. The methods may comprise, for example chemical atomic layer etching methods in which a substrate surface is contacted with an etch reactant comprising a vapor phase N-substituted derivative of an amine compound. Reaction by-products comprising atoms of the target material may be removed from the vicinity of the substrate surface, such as by purging.

In some embodiments, methods of etching a metal, metal oxide or metal nitride film on a substrate surface in a reaction space are provided. In some embodiments the substrate is a semiconductor substrate. In some embodiments the methods comprise one or more etching cycles. Each etching cycle may comprise contacting the substrate with an etch reactant comprising a vapor-phase N-substituted derivative of an amine compound and subsequently removing excess etch reactant and reaction by-products, if any, from the reaction space.

In some embodiments the N-substituted derivative of an amine compound comprises a functional group. The functional group may be, for example, selected from —$PH_2$, —$PR_2$, —PHR, —$NH_2$, —$NR_2$, —NHR, —F, —Cl, —Br, —I, —SR, —$SO_2R$, —$OSO_2R$, —CN, —$ONO_2$, —OCOR, —OTs, —OMs, and H. In some embodiments the etch reactant comprises a compound having the formula (L1L2X)N, where L1 and L2 are substituted alky, aryl or alkyl-substituted silyl groups and X is a functional group selected from —$PH_2$, —$PR_2$, —PHR, —$NH_2$, —$NR_2$, —NHR, —F, —Cl, —Br, —I, —SR, —$SO_2R$, —$OSO_2R$, —CN, —$ONO_2$, —OCOR, —OTs, —OMs, and H. In some embodiments the etch reactant comprises bis(trialkylsilyl)amine.

In some embodiments the etch reactant comprises a compound having the formula:

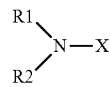

where each of R1 and R2 can independently be any of: any alkyl group, any aryl group and any trialkylsilyl group and X can be any of —$PH_2$, —$PR_2$, —PHR, —$NH_2$, —$NR_2$, —NHR, —F, —Cl, —Br, —I, —SR, —$SO_2R$, —$OSO_2R$, —CN, —$ONO_2$, —OCOR, —OTs, —OMs, and H.

In some embodiments the etch reactant comprises a compound having the formula:

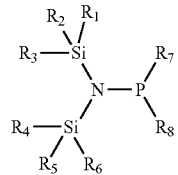

wherein each R1-R6 can independently be any of H, Me, Et, iPr, nPr, tBu, sBu, nBu, an isomer of pentyl, any isomer of hexyl, phenyl and fluoro, and each R7 and R8 can independently be any of H, Me, Et, iPr, nPr, tBu, sBu, nBu, any isomer of pentyl, any isomer of hexyl, phenyl and fluoro.

In some embodiments the metal of the metal, metal oxide or metal nitride is selected from Co, Ni, Cu, Fe, Mn, Ti, Ta, Hf, Zn, La, Sc, Mo and Cr.

In some embodiments the etch cycle is repeated two or more times in a row. In some embodiments the etch cycle is incorporated into a deposition process. In some embodiments the etch cycle is incorporated into a selective deposition process.

In some embodiments the methods comprise contacting the substrate surface with an etch reactant and a vapor-phase second reactant. The vapor-phase second reactant may comprise a halide, an oxidant, or a plasma reactant. In some embodiments the substrate surface is contacted with the vapor-phase second reactant after the etch reactant.

In some embodiments methods of etching a metal or metal nitride layer on a substrate surface comprise a cyclic process in which the metal or metal nitride layer on the substrate surface is contacted with an oxidant to form metal oxide on the substrate surface and subsequently contacting the metal oxide with a vapor-phase etch reactant comprising an N-substituted derivate of an amine compound. Reaction by-products comprising atoms of the metal or metal nitride layer may be removed from the vicinity of the substrate surface, such as by purging.

In some embodiments the oxidant comprises one or more of $O_3$, $O_2$, $H_2O$, $H_2O_2$, $SO_3$, and excited oxygen species, such as from $O_2/O_3$ plasma.

In some embodiments methods of etching a metal, metal oxide, metal nitride or metal oxynitride surface of a substrate are provided. The methods may comprise a cyclic etching process in which the substrate is contacted with a halide reactant to form a halidized surface and subsequently contacting the halidized surface with an etch reactant comprising a vapor-phase N-substituted derivative of an amine compound. In some embodiments the surface comprises a metal oxide or metal oxynitride. In some embodiments the metal oxide or metal oxynitride is formed by contacting a metal or metal nitride substrate surface with an oxidant.

In some embodiments the halide reactant comprises a metal halide, a non-metal halide, an organic halide, an interhalogen or a halogen gas.

In some embodiments methods of etching a target material such as a metal oxide, metal nitride or metal surface on a substrate comprise a cyclic process in which the target material is contacted with a plasma reactant. In some embodiments a plasma-modified surface is formed. The plasma-modified surface is contacted with an etch reactant comprising a vapor-phase N-substituted derivative of an amine compound. In some embodiments the target material comprises one or more of Co, Ni, Cu, Fe, Mn, Ti, Ta, Hf, Zn, La, Sc, Mo and Cr.

In some embodiments methods of removing one or more contaminants from a surface are provided. In some embodiments the methods comprise contacting the surface comprising one or more contaminants with a vapor-phase etch reactant comprising an N-substituted derivate of an amine compound. Reaction by-products comprising atoms of the contaminant may be removed from the vicinity of the substrate surface, for example by purging. In some embodiments the contaminants are formed during a deposition process. In some embodiments the contaminants are formed during a selective deposition process. In some embodiments the contaminants comprise a metal selected from Co, Ni, Cu, Fe, Mn, Ti, Ta, Hf, Zn, La, Sc, Mo and Cr.

DETAILED DESCRIPTION

Figure 1:
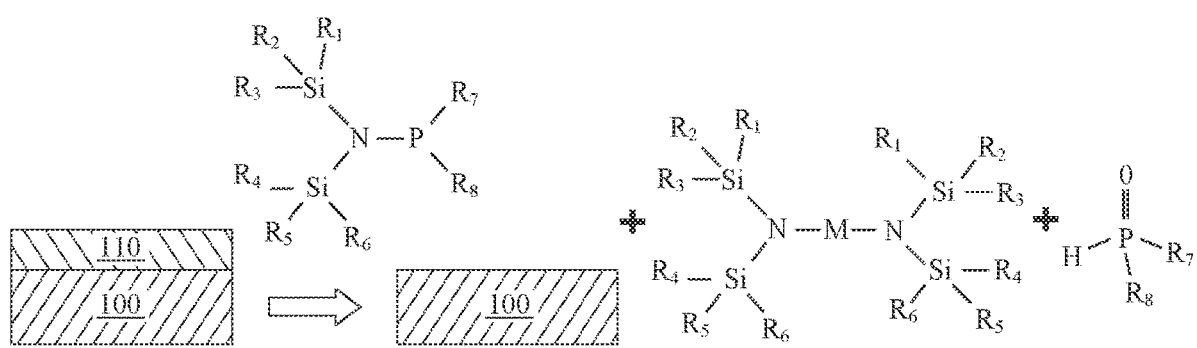
FIG. 1 is a schematic diagram of a process for etching metal oxide from a metal layer.

A sub-monolayer or more of material can be removed from a substrate by etching processes comprising contacting the substrate surface in a reaction space with at least one vapor-phase etch reactant. In some embodiments one or more vapor phase N-substituted derivatives of amine reactants are used as the etch reactant. The etch reactants may be N-substituted with a functional group. In some embodiments a vapor-phase etch reactant comprises, for example, an N-substituted derivative of an amine having the formula (L1L2X)N, where L1 and L2 are substituted alky, aryl or alkyl-substituted silyl groups and X is a functional group. In some embodiments the functional group X may be selected from $-PH_2$, $-PR_2$, $-PHR$, $-NH_2$, $-NR_2$, $-NHR$, $-F$, $-Cl$, $-Br$, $-I$, $-SR$, $-SO_2R$, $-OSO_2R$, $-CN$, $-ONO_2$, $-OCOR$, $-OTs$, $-OMs$, and H. In some embodiments the N-substituted derivative of amine reactant is bis(trialkylsilyl)amine. In some embodiments the functional group can promote reaction with, for example, metal oxides to liberate a volatile metal bis(trialkylsilyl)amido complex and an oxidized version of the functional group. In some embodiments the etching processes are atomic layer etching (ALE) processes.

The disclosed etching processes can be used to remove material from a substrate surface. The material to be removed may be referred to as the etch-target material or target material. In some embodiments the target material is the material of the substrate surface itself. For example, in some embodiments metal may be etched from a metal surface. In some embodiments a target material may be a metal, metal oxide, metal nitride or metal oxynitride substrate surface that is to be etched. In some embodiments the target material comprises contaminants on a substrate surface. For example, contaminants may be etched from a substrate surface comprising a material that has a different composition than the contaminants.

In some embodiments surface contamination, such as metal oxide or parasitic metal, may be removed from a substrate surface, for example from a metal surface or a dielectric surface. In this context contamination can be considered any unwanted atoms on the surface. In some embodiments contaminants may be, for example metal contaminants, metal oxide contaminants, or metal nitride contaminants. In some embodiments at least a portion of the total amount of one or more contaminants is removed from a substrate surface. In some embodiments a contaminant comprises a different metal from a metal of an underlying substrate surface.

In some embodiments contaminants may be removed from a substrate surface such as from a film during deposition of that film by providing one or more selective etching steps as described herein at one or more points during a deposition process, such as at regular intervals in a deposition process. In some embodiments one or more selective etching steps may be carried out at one, two or more intervals in a vapor deposition process. In some embodiments a selective etching step may be carried out following one or more deposition cycles in a cyclic vapor deposition process. For example, a selective etching step may be carried out every nth deposition cycle in a cyclic vapor deposition process like an atomic layer deposition (ALD) process, where n is an integer. In some embodiments a selective etch step may be carried out after every cycle in a cyclic vapor deposition process such as an ALD process.

In some embodiments an etch-target material comprises surface contaminants formed during a vapor deposition process. In some embodiments an etch-target material comprises surface contaminants formed during a selective deposition process. For example, in some embodiments the target material to be etched is parasitic material grown unwantedly from an area-selective deposition processes. In some embodiments the parasitic material comprises metal atoms such as Co, Al, Cu, Mo, Nb, V, Ni, Fe, Ta, La or Hf. In some embodiments an etch process as described herein, such as an ALE process, is combined with an area selective deposition process. In some embodiments an etch step or process is provided at one or more intervals in a selective deposition process. In some embodiments this allows for the removal of parasitic material as the deposition process progresses.

In some embodiments a surface to be etched is contacted with a reactant as described herein for a sufficient time to achieve the desired level of etching. In some embodiments etching is carried out in a single step. In some embodiments an etch process comprises multiple phases. For example, an etch process may comprise a first phase in which a substrate in a reaction space is contacted with a vapor phase etching agent and a second phase in which the substrate is contacted with a different reactant. In some embodiments, ALE processes comprise an etching cycle. An etching cycle may comprise one or more phases in which a substrate in a reaction space is contacted with a vapor phase etching agent (also referred to as a reactant or etch reactant) and excess etching agent and reaction byproducts are subsequently removed from the reaction space. In some embodiments this etch cycle can be repeated multiple times. In some embodiments an etch cycle is repeated multiple times sequentially. In some embodiments an etch cycle is repeated at intervals, for example at one, two or more intervals in another deposition process such as an area selective deposition process. In some embodiments ALE processes comprise alternately contacting the substrate surface in a reaction space with more than one reactant, such as first and second vapor-phase reactants. Excess reactant may be removed between contacting the substrate with each reactant. In some embodiments, one or more of the vapor-phase reactants is an N-substituted derivative of amine reactants, such as a bis(trialkylsilyl)amine reactant, as described herein. One or more etch cycles may be provided in an ALE process.

As mentioned above, in some embodiments, one or more etch cycles comprise exposing the substrate to at least one reactant. In some embodiments one or more etch cycles comprise alternately exposing the substrate to two different reactants. In some embodiments, the etch cycles comprise exposing the substrate to three different reactants. In some embodiments the etch cycles comprise exposing the substrate to four different reactants. In some embodiments, the etch cycles comprise exposing the substrate to more than four different reactants. Excess reactant and reaction byproducts, if any, may be removed between contacting the substrate with each reactant. For example, each reactant exposure may be separated by a purge of the reaction space, and/or by pumping down the reaction chamber to remove reaction by products and excess reactant.

In some embodiments an etch reactant comprises an N-substituted derivative of an amine having the formula (L1L2X)N, where L1 and L2 are substituted alky, aryl or alkyl-substituted silyl groups and X is a functional group. In some embodiments the functional group X may be selected from —$PH_2$, —$PR_2$, —PHR, —$NH_2$, —$NR_2$, —NHR, —F, —Cl, —Br, —I, —SR, —$SO_2R$, —$OSO_2R$, —CN, —$ONO_2$, —OCOR, —OTs, —OMs, and H. In some embodiments an etch reactant comprises bis(trialkylsilyl) amine. In some embodiments an etch reactant comprises hexamethyldisilazane (HMDS). In some embodiments an etch reactant comprises a phosphinous amide, such as P,P-dimethyl-N,N-bis(trimethylsilyl)-phosphinous amide ($C_8H_{24}NPSi_2$). In some embodiments an etch reactant comprises a phosphoramidous dichloride, such as N,N-bis(trimethylsilyl)-phosphoramidous dichloride ($C_6H_{18}Cl_2NPSi_2$). In some embodiments an etch reactant comprises a phosphoramidous acid, such as bis(trimethylsilyl)-phosphoramidous acid, diethyl ester ($C_{10}H_{28}NO_2PSi_2$).

In some embodiments, the substrate to be etched is exposed to an etch reactant comprising one or more N-substituted derivative of amine reactants selected from compounds having the formula I, below, where R1 and R2 can independently be any of: any alkyl group, any aryl group and any trialkylsilyl group and X can be any of —$PH_2$, —$PR_2$, —PHR, —$NH_2$, —$NR_2$, —NHR, —F, —Cl, —Br, —I, —SR, —$SO_2R$, —$OSO_2R$, —CN, —$ONO_2$, —OCOR, —OTs, —OMs, and H. In some embodiments the groups R1 and R2 can be either substituted or unsubstituted, saturated or unsaturated, branched or linear, and either alkyl or aryl groups. In some embodiments, the first reactant may comprise bis(trialkylsilyl)amine. In some embodiments the first reactant may comprise bis(trimethylsilyl)amine.

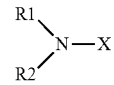

I

In some embodiments the reactant is selected from compounds having the formula II below, where each of R1-R6 can independently be any of H, Me, Et, iPr, nPr, tBu, sBu, nBu, an isomer of pentyl, any isomer of hexyl, phenyl and fluoro, and each of R7 and R8 can independently be any of H, Me, Et, iPr, nPr, tBu, sBu, nBu, any isomer of pentyl, any isomer of hexyl, phenyl and fluoro. In some embodiments the groups R1-R8 can be substituted or unsubstituted, saturated or unsaturated, branched or linear, and either alkyl or aryl groups. In some embodiments the R1-R6 groups attached to silicon atoms can be either same or different from each other.

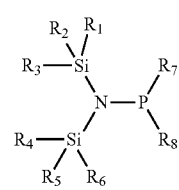

II

In some embodiments the reactant comprises hexamethyl disilazane (HMDS) or bis(trialkylsilyl)amine.

In some embodiments, the etch cycles comprise a step in which the substrate is contacted with at least one of the N-substituted derivative of amine reactants such as bis(trialkylsilyl)amine as described herein. For example, the substrate may be contacted with a first vapor-phase reactant comprising an etch reactant such as bis(trialkylsilyl)amine. Exposure of the substrate to the etch reactant leads to formation of volatile by-products that contain atoms from the surface being etched. The volatile reaction by-products can be removed from the vicinity of the substrate surface. In this way, the etching of the desired material on the substrate surface can be carefully controlled.

In some embodiments the surface reactions are self-limiting or self-saturating. In some embodiments, the etch cycles comprise a saturative, self-limiting adsorption step in which the substrate is contacted with the etching reactant. For example, the substrate may be contacted with a first vapor-phase reactant followed by a second exposure step in which the substrate is contacted with a second vapor-phase reactant. In the first adsorption step, the first reactant adsorbs in a self-limiting manner to the material to be etched on the substrate surface. The second exposure step then leads to the formation of volatile by-products that contain the adsorbate atoms, the second reactant atoms and some atoms from the surface being etched. In this way, the etching of the desired material on the substrate surface can be carefully controlled.

In some embodiments the reactions are not self-limiting or saturating. In some embodiments, at least one of the phases, such as exposure to a first vapor phase reactant, exposure to a second vapor phase reactant or exposure to additional reactants in one or more additional phases, or a reaction itself, such as the etching reaction, is not selflimiting or saturating. In some embodiments, exposure to the first vapor-phase reactant is not self-limiting. In some embodiments exposure to a second vapor phase reactant is not self-limiting. In some embodiments exposure to a first vapor phase reactant is not self-limiting and exposure to a second vapor phase reactant is not self-limiting. However, in some embodiments even if one or more portions of the etch cycle is not self-limiting, controlled etching may be achieved by supplying a controlled dose of one or more of the reactants.

In some embodiments, gas phase reactions are avoided by feeding the reactants alternatively and sequentially into the reaction chamber. Vapor phase reactants are separated from each other in the reaction chamber, for example, by removing excess reactants and/or reaction by-products from the reaction chamber between reactant pulses. The reactants may be removed from the proximity of the substrate surface with the aid of a purge gas and/or vacuum. In some embodiments, excess reactants and/or reactant byproducts are removed from the reaction space by purging, for example, with an inert gas. Because of the separation of reactants and the self-limiting nature of the reactions, less than a monolayer of material is typically removed in each ALE etch cycle. However, in some embodiments, more than one monolayer may be removed in each cycle. In some embodiments, pulses of reactants may partially or completely overlap. For example, in some embodiments, one reactant may flow continuously into the reaction space while one or more additional reactants are provided intermittently, at desired intervals.

In some embodiments, the ALE methods disclosed herein are thermal etching processes, as opposed to plasma etching processes. Thus, plasma reactants are not used in the ALE etch cycles. While referred to as thermal ALE processes to differentiate processes that use plasma reactants, in some embodiments, the ALE reactions may have zero activation energy and therefore may not require any additional thermal energy. Thus, such reactions that do not use plasma reactants may also be referred to as chemical etching processes herein. Thermal ALE methods can be more desirable in some situations than plasma ALE methods because thermal ALE methods can be less damaging to the underlying substrate.

In some embodiments, a N-substituted derivative of amine is used as a first reactant. For example, in some embodiments the first reactant may be bis(trialkylsilyl) amine or HMDS (hexamethyldisilazane).

As mentioned above, in some embodiments the ALE process is a thermal process, and a plasma reactant is not used as a first or second reactant. As mentioned below, in some embodiments a plasma reactant is used in an ALE process.

In some embodiments, one or more additional reactants may be utilized. In some embodiments, one or more reactants may be used to improve or tune selective etching. The additional reactants may be provided separately, or may be combined with one or more etch reactants. An additional reactant may be an oxygen source. For example, an additional reactant may comprise, for example, water, oxygen, ozone $H_2O_2$, $SO_3$, or reactive oxygen species, such as oxygen plasma. In some embodiments an additional reactant may be a halide reactant, such as a metal halide, semi-metal halide, organic halide, interhalogen or halogen gas, or non-metal halide.

In some embodiments, an oxidizing agent such as water, oxygen and/or ozone is utilized as a first vapor phase reactant in an etching process. For example, a metal surface can be oxidized by exposure to an oxidizing agent, followed by exposure to a bis(trialkylsilyl)amine etch reactant that reacts with the oxidized surface to remove material from the surface, thus etching the surface. Exposure to the oxidant and the one etch reactant can be repeated one, two or more times to remove the desired amount of material, and to leave a metal surface. Exposure to the oxidant and the etch reactant may be separated by a step in which excess oxidant is removed from the reaction space.

In some embodiments, a halide reactant is used as a first vapor phase reactant in an etching process. The halide reactant reacts with the species on the substrate surface to form a halidized surface. The substrate is then contacted with an etch reactant comprising an N-substituted derivative of amine reactant, as described herein, for example bis (trialkylsilyl)amine, to form volatile reaction products comprising material from the substrate surface that can be removed from the reaction space, thus etching the surface. Removal can be carried out, for example, by purging the reaction space with the aid of a purge gas, and/or with the aid of a vacuum. Exposure to the halide reactant and the etch reactant can be repeated to remove the desired amount of material, and to leave a desired surface termination. Exposure to the oxidant and the etch reactant may be separated by a step in which excess oxidant is removed from the reaction space. Exemplary halide reactants that may be used are described, for example, in U.S. Pat. Nos. 10,283,319; 10,273,584; and 10,280,519, each of which is incorporated herein by reference.

In some embodiments, a halide reactant may be a metal halide. In some embodiments the metal halide comprises a transition metal halide, for example, halides such as chlorides, fluorides, bromides or iodides of group 5 or 6 transition metals. In some embodiments the metal in the halide reactant may be, for example, Nb, Ta, Mo Sn, V, Re, or W. In some embodiments, the metal halide reactant comprises Sb or Te. In some embodiments, the metal halide first reactant is a metal chloride, such as $NbCl_5$, $SnCl_4$, $TaCl_5$, MoClx where x is from about 3 to 5, or WClx where x is from about 4 to 6. In some embodiments the metal halide first reactant is a metal fluoride, such as $NbF_5$, $TaF_5$, $WF_6$, $VF_5$, $SbF_5$, or $MoF_6$. In some embodiments, a non-metal or semi-metal fluoride like $TeF_6$, $SbF_5$ or $AsF_5$ can be used as a halide reactant. In some embodiments, the metal halide reactant may comprise a metal bromide or metal iodide, such as $SnBr_4$, $SnI_4$.

In some embodiments, the halide reactant may comprise a compound of formula $MO_cX_aY_b$, wherein c can be greater than zero, and a and, or b can be greater than or equal to one and can be greater than equal to zero, and M can be any transition metal. For example, in some embodiments, M can be rhenium, niobium, tungsten, titanium, vanadium, or chromium. X and Y can be halides different from each other or X and Y can same halide. In some embodiments, the halide reactant may comprise a compound of formula $MoOF_4$, $ReOF_4$, $WOF_4$, $ReOF_5$, $ReO_2F_2$, $ReO_2Cl_3$, $NbOF_3$.

In some embodiments, the halide reactant may comprise antimony and a halide, such as fluorine. In some embodiments, the halide reactant may comprise antimony, fluorine and hydrogen. In some embodiments, the halide reactant may comprise antimony, fluorine, oxygen and nitrogen. In some embodiments, the halide reactant may comprise antimony, fluorine and oxygen. In some embodiments, the halide reactant may comprise antimony, fluorine and at least one ligand other than antimony or fluorine. In some embodiments, the halide reactant may comprise a fluoroantimonic salt compound. For example, in some embodiments, the halide reactant may comprise hexafluoro antimonic acid (HSbF$_6$), nitronium hexafluoroantimonate NO$_2$SbF$_6$, nitrosonium hexafluoroantimonate (NOSbF$_6$), or hexafluoroantimonic acid hydrate (HSbF$_6$.6H$_2$O).

In some embodiments, the halide reactant does not comprise a metal. In some embodiments, a semi-metal-based halide is utilized, for example a halide reactant may comprise GeCl$_4$.

In some embodiments, the halide reactant comprises an organic halide compound. In some embodiments, the halide reactant comprises an alkyl halide, an acyl halide, a sulfonyl halide, a sulfenyl halide, a selenyl halide, or a boron halide comprising an organic ligand.

In some embodiments, the halide reactant may comprise an aromatic, saturated, or unsaturated aliphatic alkyl halide compound comprising two or more carbon atoms. In some embodiments, the halide reactant may comprise a substituted alkyl halide. For example in some embodiments, the halide reactant may comprise tert-butyl chloride, 1,1-dichloroethane, 1,2-dichloroethane, or trichloroethane, trifluoroethanol, trifluoroisopropanol. In some embodiments, the first reactant may comprise an aromatic, saturated, or unsaturated aliphatic alkene halide compound. For example, in some embodiments, the halide reactant may comprise a substituted vinyl halide, or an allyl halide.

In some embodiments, the halide reactant comprises fluorosulfonic acid, trifluoromethanesulfonic acid, trifluoromethyl trifluoromethanesulfonate, sulfur tetrafluoride sulfur chloride pentafluoride, sulfur hexafluoride, or 1-chloro 2-(pentafluorosulfuranyloxy)ethane. In some embodiments, the halide reactant comprises chlorosulfonyl isocyanate or N,N-dimethylsulfamoyl chloride. In some embodiments the halide reactant comprises boron, hydrogen and a halide.

In some embodiments, the halide reactant may comprise organic oxyhalide. In some embodiments, the halide reactant may comprise an acyl halide compound, such as an aromatic, saturated, or unsaturated aliphatic acyl halide compound, including di, and tri acyl halides. For example, in some embodiments, the halide reactant may comprise fumaryl chloride, malonyl chloride, succinyl, or oxalyl halide. In some embodiments, the first reactant may comprise terephthaloyl chloride. In some embodiments, the halide reactant may comprise 1,3,5-benzenetricarbonyl trichloride.

In some embodiments, a halide reactant is a non-metal halide such as S$_2$Cl$_2$, Se$_2$Cl$_2$, SCl$_2$, SeCl$_4$, SeF$_4$, SeF$_6$ or SeCl$_2$. In some embodiments, a non-metal halide may have the formula NXa, where X is chlorine, bromine, fluorine, or iodine; N is nitrogen, phosphorous, sulfur, selenium, silicon, tellurium, antimony, boron, germanium, or carbon; and 'a' is a stoichiometric indicator greater than or equal to 1 and less than 7. In some embodiments 'a' is less than or equal to 6, less than or equal to 5, less than or equal to 4, less than or equal to 3, less than or equal to 2 or 1. In some embodiments the non-metal halide may be a semi-metal halide, such as SiCl$_4$, SbCl$_3$, SbF$_5$, SbCl$_5$ or BCl$_3$. In some embodiments, a semi-metal halide reactant may have the formula SXa, where X is chlorine, bromine, fluorine, or iodine; S is silicon, tellurium, antimony, boron, or germanium; and 'a' is a stoichiometric indicator from 1 to 7. In some embodiments, the halide reactant is a semimetal halide such as a Ge or Sb halide, for example a semimetal chloride, like SbCl$_3$, SbCl$_5$, SiCl$_4$, or GeCl$_4$. In some embodiments, the halide may be a semi-metal or non-metal oxyhalide such as SeO$_2$Cl$_2$, SO$_2$Cl$_2$, COF$_2$, SO$_2$F$_2$, SOF$_2$, SeOCl$_2$. In some embodiments, the halide may be an organic (oxy)halide such as NCl$_2$F, NF$_2$Cl, NOF, NO$_2$F. In some embodiments non-metal halides, such as semi-metal halides, semi-metal oxyhalides and/or non-metal (oxy) halides can be used.

In some embodiments, a halide reactant may comprise carbon and a halogen. In some embodiments, a carbon-based halide comprises CCl$_4$ or CBr$_4$. In some embodiments, a non-metal halide reactant comprises a carbon-based organic halide. Carbon-based halides, including CCl$_4$, can be considered to be organic or alkylhalides. In some embodiments, a carbon based organic oxyhalide is used as a halide reactant and may comprise, for example, triphosgene or bis(trichloromethyl) carbonate (C$_3$Cl$_6$O$_3$).

In some embodiments, a halide reactant may comprise a halide, carbon and oxygen. In some embodiments, the halide reactant may comprise, for example, bis(trichloromethyl) carbonate (Cl$_6$C$_3$O$_3$), or trichloromethyl chloroformate.

In some embodiments, a halide reactant comprises one or more CF$_3$ groups. In some embodiments, the halide reactant may comprise a CF$_3$ group that may assist in selective etching. In some embodiments, the halide reactant may comprise a CF$_3$ group and sulfur. In some embodiments, the halide reactant may comprise a CF$_3$ group, nitrogen and oxygen. In some embodiments, the halide reactant may comprise a CF$_3$ group, carbon, hydrogen and oxygen, for example chlorodifluoroacetic acid. In some embodiments, the halide reactant may comprise a CF$_3$ group and a NH$_2$ group. In some embodiments, the halide reactant may comprise a CF$_3$ group, a NH$_2$ group and either oxygen or sulfur.

In some embodiments, a halide reactant may comprise a CF$_3$ group, oxygen and nitrogen, and may be connected via hydrocarbon chain, such as an alkyl chain. In some embodiments, the halide reactant may comprise 1 or more CX$_a$Y$_b$ groups, wherein X and Y are halides and can be, but are not limited to, fluorine and/or chlorine. In some embodiments, the halide reactant may comprise a compound of formula CX$_a$Y$_b$, wherein a and b can be greater than or equal to one, for example, in some embodiments, a first reactant may comprise CCl$_3$Br, CCl$_2$Br$_2$. In some embodiments, the halide reactant may comprise a compound of formula CHX$_a$Y$_b$, wherein a and b can be greater than or equal to one, for example in some embodiments, a halide reactant may comprise CHCl$_2$Br, CHCl$_3$, CHCl$_2$Br or CHClBr$_2$.

In some embodiments, a halide reactant may comprise carbon, hydrogen and oxygen, for example chlorodifluoroacetic anhydride. In some embodiments, the halide reactant may comprise HCl or HF, for example as a stabilizer when the halide reactant is not in vaporized form in the reactant source vessel. In some embodiments, the halide reactant may comprise HCl, which is supplied separately to the reaction chamber.

In some embodiments a non-metal halide reactant comprises a carbon based halide having the general formula CXaY4–a, and CnXaY(2n+2–a), where in X is any halide and 'a' can be greater than 1, n can be greater than or equal to 1 and Y is a non-metal, and may be a semi-metal.

In some embodiments, a non-metal halide reactant has the formula Ligand-SX$_2$ or Ligand-SX$_3$, where X is a halide and S can be sulfur or phosphorus, and Ligand can be a dialkylether, such as dimethylether, dialkylthioether, or di-methylthioether; an alkylamine, such as dimethylamine; benzene; an alkyl group; pyridine; thiophene; cyclopropane; or n-haloiminosulfur. In some embodiments, the non-metal halide reactant can be trifluoro(N-methylmethanaminato)sulfur. In some embodiments, the non-metal halide reactant comprises N-fluoroformyliminosulfur difluoride (SF2=NCOF). In some embodiments, the non-metal halide reactant is a semi-metal halide reactant with the formula SX$_a$, where X is chlorine, bromine, fluorine, or iodine; S is silicon, tellurium, antimony, boron, or germanium; and a is a stoichiometric indicator from 1 to 6, from 1 to 5, from 1 to 4, from 1 to 3, from 1 to 2, or 1.

In some embodiments, a halide reactant may comprise a sulfonyl halide, such as an aromatic, saturated, or unsaturated aliphatic sulfonyl halide. In some embodiments, the halide reactant may comprise, for example, ethanesulfonyl fluoride ($C_2H_5FO_2S$), methanesulfonyl chloride ($CH_3ClO_2S$), methanesulfonyl fluoride ($CH_3FO_2S$), phenylsulfonyl fluoride ($PhFO_2S$), pyridinesulfonyl fluoride ($C_5H_4FNO_2S$), thiophenesulfonyl fluoride ($C_4H_3FO_2S_2$), cyanomethanesulfonyl chloride ($C_2H_2ClNO_2S$), chloromethanesulfonyl chloride ($ClCH_2SO_2Cl$), or trifluoromethanesulfonyl chloride ($CF_3SO_2Cl$) etc. In some embodiments, the halide reactant may comprise a sulfenyl halide compound or selenenyl halide compound. For example, in some embodiments, the halide reactant may comprise trichloromethanesulfenyl chloride ($CCl_3SCl$), or chlorocarbonylsulfenyl chloride (ClCOSCl). In some embodiments, the halide reactant may comprise a compound having the formula PhSeCl, wherein Ph is a phenyl group. In some embodiments, the halide reactant may comprise a compound having the formula RSeX, wherein R is an alkyl ligand and X is a halide.

In some embodiments a halide reactant may comprise a compound comprising oxygen and sulfur and a halide. In some embodiments, the halide reactant may comprise a compound comprising oxygen and sulfur and a halide and hydrogen or a hydrocarbon group, such as alkyl group, including cyclic alkyl groups, for example cyclopropylsulfonyl chloride.

In some embodiments, a halide reactant may comprise a sulfinyl halide, such as an aromatic or aliphatic or substituted aromatic or substituted aliphatic, saturated, or unsaturated sulfinyl halide. In some embodiments, the halide reactant may comprise, for example, trichloromethanesulfinyl chloride, trifluoromethanesulfinyl fluoride, trifluoromethanesulfinyl chloride, tert-butylsulfinyl chloride.

In some embodiments, a halide reactant may comprise a sulfonic acid halide compound such as an aromatic or aliphatic or substituted aromatic or substituted aliphatic, saturated, or unsaturated sulfonic acid halide. For example, in some embodiments, the halide reactant may comprise fluorosulfonic acid ($FSO_3H$) and/or trifluoromethanesulfonic acid ($CF_3SO_3H$).

In some embodiments, a halide reactant may comprise a selenium or sulfur and a halogen, such as $SeX_a$ where X is halide Se is selenium and a is greater than zero for instance $SeF_4$ or $SeCl_4$ or $SeF_6$, sulfur tetrafluoride, sulfur chloride pentafluoride or sulfur hexafluoride.

In some embodiments, a halide reactant may comprise sulfur, carbon, and one or more halide atoms, such as thiophosgene ($CSCl_2$).

In some embodiments, a halide reactant may comprise sulfur, phosphorous, and one or more halide atoms, such as thiophosphoryl chloride ($PSCl_3$) and thiophosphoryl fluoride ($PSF_3$).

In some embodiments, a halide reactant may comprise a sulfonate compound, such as an aromatic or aliphatic or substituted aromatic or substituted aliphatic, saturated, or unsaturated sulfonate halide. For example, in some embodiments, the halide reactant may comprise trimethylsilyl trifluoromethanesulfonate ($C_4H_9F_3O_3SSi$) and trifluoromethyl trifluoromethanesulfonate ($CF_3SO_3CF_3$).

In some embodiments, a halide reactant may comprise a substituted sulfur trifluoride having the formula $A\text{-}SF_3$, wherein A can be dimethylsulfide, diethylsulfide, benzene, alkyl group, pyridine, thiophene, cyclopropane, or aminato groups including methylmethanaminato in trifluoro(N-methylmethanaminato)sulfur.

In some embodiments, a halide reactant may comprise a sulfurane compound having the formula $X\text{—}O\text{—}SF_y$, wherein X is an alkyl ligand, an aromatic ligand or a halide and y is from 1 to 5. For example, in some embodiments, the reactant may comprise 1-chloro 2-(pentafluorosulfuranyloxy)ethane ($SF_5OC_2H_2Cl$).

In some embodiments, a halide reactant may comprise sulfur, oxygen and a halide, such as chlorine or fluorine, and a hydrocarbon and may include cyclic alkyl group, for example a cyclopropyl group e.g. cyclopropylthionylchloride.

In some embodiments, a halide reactant may comprise a reactant with general formula Ligand-$CCl_3$. In some embodiments, the halide reactant may comprise nitrogen, a halide, carbon and oxygen. For example, the halide reactant may comprise trichloronitromethane ($CCl_3NO_2$) or trichloroacetyl isocyanate ($Cl_3CCONCO$).

In some embodiments, a halide reactant may comprise hydrogen, halide, carbon and oxygen. In some embodiments, the first reactant may comprise, for example, an alkyl chloroformate such as ethyl chloroformate, methyl chloroformate, propyl chloroformate, chloromethyl chloroformate, or 2,2,2-trichloroethoxycarbonyl chloride.

In some embodiments, a halide reactant may comprise nitrogen, hydrogen, halide, carbon and oxygen. In some embodiments, the halide reactant may comprise, for example, trichloroacetamide or substituted trichloroacetamide (O-Allyl 2,2,2-trichloroacetimidate).

In some embodiments, a halide reactant may comprise nitrogen, halide, and carbon. In some embodiments, the halide reactant may comprise, for example, trichloroacetonitrile. In some embodiments, the halide reactant may comprise nitrogen, carbon, sulfur, a halide and oxygen. In some embodiments, the halide reactant may comprise carbon, sulfur, a halide, hydrogen and oxygen. In some embodiments, the halide reactant may comprise nitrogen, carbon, sulfur, a halide, hydrogen and oxygen. In some embodiments, the halide reactant may comprise chlorosulfonyl isocyanate, chloromethyl chlorosulfate, or N,N-dimethylsulfamoyl chloride.

In some embodiments, a halide reactant may comprise a halogen and succinimide group. In some embodiments, for example, the halide reactant may comprise N-chlorosuccinimide, N-bromosuccinimide.

In some embodiments, a halide reactant may comprise boron, a halide and hydrogen. In some embodiments, the halide reactant may comprise boron, fluorine and hydrogen. In some embodiments, the halide reactant may comprise $HBF_4$, for example.

In some embodiments, a halide reactant may comprise a boron trihalide in a stabilizer, wherein the stabilizer may be, for example, alkylamine, alkylnitrile, water, or dimethylsulfide, or other compound that may form either volatile complexes or adducts with boron trihalides. In some embodiments, the halide reactant may comprise, for example, a boron trifluoride ethylamine complex.

In some embodiments, a halide reactant may comprise a boron halide of general formulae $BX_aY_b$, wherein 'a' and 'b' can be greater than or equal to zero, or greater than or equal to one, and wherein X and Y can be halide, including fluorine, chlorine and bromine and iodine. The halide reactant may be stabilized in an organic stabilizer containing at least one carbon, oxygen or hydrogen, including, for example, ethanol, diethyl ether, dimethyl ether, dimethylsulfide.

In some embodiments, a halide reactant may comprise a boron halide compound comprising an organic ligand. For example, in some embodiments, the halide reactant may comprise a compound having the formula $BX_nL_{3-n}$, wherein L is an organic ligand, such as an acetylacetonato (acac) ligand, X is a halide, and n is 1 or 2. In some embodiments, the halide reactant may comprise $BF_2acac$.

In some embodiments, a halide reactant may comprise a tetrafluoroboric acid diethyl ether complex. In some embodiments, the halide reactant may comprise, for example, trifluoride dihydrate. In some embodiments, the halide reactant may comprise, for example, a boron trifluoride tetrahydrofuran complex.

In some embodiments, a halide reactant may comprise sulfur, nitrogen and one or more halide atoms, such as thiazyl chloride, thiazyl fluoride, thiazyl trifluoride ($NSF_3$). In some embodiments, the halogen reactant may comprise a halogen, nitrogen, oxygen and sulfur. In some embodiments, the first reactant may comprise, for example, NSOCl.

In some embodiments, a halide reactant may comprise phosphorous and one or more halide atoms. In some embodiments, the halide reactant may comprise phosphorous, oxygen and one or more halide atoms, such as phosphoryl chloride ($POCl_3$).

In some embodiments, a halide reactant may comprise a ligand, phosphorous, oxygen and one or more halides. In some embodiments the first reactant may have the general formula ligand-$PDX_2$. Exemplary ligands include dialkyl amido (e.g. N,N-dimethylphosphoramic dichloride), phenyl (e.g. phenylphosphoryl dichloride) and alkyl (e.g. tert-butylphosphonyl dichloride and methylphosphonyl dichloride).

In some embodiments, a halide reactant may comprise a ligand, phosphorus and one or more halides. In some embodiments the first reactant may have the general formula ligand-$PX_2$, wherein X is halide including not just chlorine and fluorine. For example, the halide reactant may comprise dimethylphosphoramidous dichloride.

In some embodiments, a halide reactant may comprise a halogen and oxygen. In some embodiments, the halide reactant may comprise an oxyhalide having general formulae $O_bX_a$ or $O_bX_aY_c$. In some embodiments, the halide reactant may comprise more than one halogen and more than one oxygen. In some embodiments, the halide reactant may comprise $OF_2$, $FClO_2$, or $FClO_3$.

In some embodiments, a halide reactant may comprise a halo-halogen compound having the general formula $X_aY_b$, wherein X and Y can be chlorine or fluorine or bromine or iodine, a and b are the stoichiometric coefficients, where each of a and b can be greater than or equal to 1. In some embodiments, the halide reactant may comprise ClF, BrCl, $ClF_3$, $BrF_3$, $ClF_5$, $BrF_5$, $IF_5$, $IF_7$, $ICl_3$, $ICl_5$ or ICl. In some embodiments, the halide reactant does not comprise an interhalogen compound such as $ClF_3$ or $ClF_5$.

Although referred to as the first, second etc. vapor phase reactants, they may be supplied in a different order in different embodiments. For example, in some embodiments the first vapor phase reactant is supplied before a second vapor phase reactant. In some embodiments a second vapor phase reactant is supplied before the first vapor phase reactant. The order of supplying the first and second vapor phase reactant maybe changed, for example reversed in one or more etch cycles.

One or more additional phases in which the substrate is contacted with a vapor-phase reactant can be introduced before or after the supplying the first and/or second vapor phase reactants.

In some embodiments for controlled etching, one or more ALE cycles are carried out, with each cycle removing material from the desired substrate surface. In some embodiments, up to a monolayer of material is removed in each ALE cycle. In some embodiments the mass removed per cycle is about a monolayer of volume, assuming density does not change. In some embodiments, more than a monolayer per cycle is removed.

In some embodiments, the etching is continuous etching and can be controlled by various process parameters such as pressure, temperature, exposure times and purge times etc.

Each ALE cycle typically comprises one or more distinct phases. In some embodiments, an ALE cycle comprises at least two distinct phases. Unless indicated otherwise, in each phase the substrate is contacted with a single reactant.

In at least one phase, a vapor phase first etch reactant comprising an N-substituted derivative of amine reactant as described herein contacts the substrate surface to be etched. In some embodiments the first reactant may be bis(trialkylsilyl)amine or HMDS. In particular, in some embodiments, the first reactant reacts with accessible substrate material, such as atoms and molecules that are to be removed from the substrate surface, to form volatile species including atoms from the surface. The volatile reaction byproducts, for example $M(N(SiMe_3)_2)_x$ species, are removed from the vicinity of the substrate surface, such as by purging the reaction space and/or with the aid of a vacuum. In some embodiments reactant can be removed from the vicinity of the substrate surface by moving the substrate.

In some embodiments the vapor phase first etch reactant reacts with a target material that is to be etched from the substrate surface. In some embodiments the target material is the material of the substrate surface itself. For example, in some embodiments a metal, metal oxide, metal nitride or metal oxynitride substrate surface is to be etched. In some embodiments the target material comprises contaminants on the substrate surface. For example, contaminants may be etched from a substrate material that has a different composition than the contaminants.

In some instances, it may be the case that the limited availability of particular substrate surface material, such as atoms and molecules that are able to react with the vapor phase first reactant species, ensures that the reaction is essentially self-limiting. In other embodiments the first reactant is not self-limiting and more than one monolayer of species may form on the substrate surface.

The first vapor phase reactant and any reaction byproducts may be removed from the proximity of the substrate or substrate surface, for example with the aid of a purge gas and/or vacuum. In some embodiments, excess reactant and/or reactant byproducts are removed from the reaction space by purging, for example, with an inert gas. In some embodiments, the substrate may be moved in order to facilitate removal of the reactant and/or reactant byproducts from the vicinity of the substrate or substrate surface, for example, by moving the substrate to a different reaction chamber.

Additional phases may be added to the etch cycle and phases may be removed as desired. For example, as discussed herein additional phases may be added to change the substrate surface to an oxide or halide surface. Additional phases may also be added to adjust the etch rate and/or to influence one or more properties of the etched material, such as its resistivity. In some embodiments, additional phases may be used for the tuning and/or controllability of one or more aspects of the etching process, such as selectivity, uniformity (such as resistance, roughness and thickness), or conformality. In some embodiments, the process comprises more than two phase, more than three phases or more than four phases or more than five phases applied in cyclic manner.

In each ALE cycle, one or more of the reactants may be provided with the aid of a carrier gas, such as Ar or He. In some embodiments, the etch reactant is provided with the aid of a carrier gas. In some embodiments, the carrier gas may flow continuously or may flow intermittently throughout the process. In some embodiments, the carrier gas may also serve as a purge gas.

The phases together form an ALE etching cycle that controllably removes material from the substrate surface. The ALE etching cycle may be repeated two or more times to etch the material on the substrate surface to a desired degree. In some embodiments, the ALE etching cycle is repeated 10, 20, 50, 100, 200, 400, 600, 800, 1000 or more times to remove the desired amount of material.

In some embodiments, two or more of the phases may overlap, or be combined. For example, a first etch reactant and a second reactant such as a halide and/or oxidant may contact the substrate simultaneously in phases that partially or completely overlap. In addition, although referred to as the first, second, and subsequent phases, and the first and second, and subsequent reactants, the order of the phases may be varied, and an ALE cycle may begin with any one of the phases.

Due to the use of vapor phase reactants, the conformality of the etching process is very good, and material can be removed evenly from all surfaces of a three-dimensional structure. In some embodiments, the conformality of etching vertically is greater than about 90% and the conformality of etching horizontally is greater than about 92%. In some embodiments, conformality of etching in vertical openings is about 50% or greater, about 75% or greater, about 85% or greater, about 90% or greater, about 95% or greater, about 98% or greater, about 99% or greater, and even up to about 100%. In some embodiments, conformality of etching in openings extending horizontally (for example from vertical openings), is about 50% or greater, about 75% or greater, about 85% or greater, about 90% or greater, about 95% or greater, about 98% or greater, about 99% or greater, and even up to about 100%. In some embodiments, conformality for a 3D structure, such as a horizontal or lateral cavity, can be greater than 50%, or greater than 80%, or even greater than 90%, or even higher than 99% and even up to about 100%. Conformality can sometimes be even greater than 100%, or greater than 120%, or greater than 150%, or greater than about 200%.

In some embodiments, the substrate comprising a material to be etched, such as a semiconductor workpiece, is loaded into a reaction space or reactor. The reactor may be part of a cluster tool in which a variety of different processes in the formation of an integrated circuit are carried out. In some embodiments, a flow-type reactor is utilized. In some embodiments, a cross-flow reactor is used. In some embodiments, a shower head type of reactor is utilized. In some embodiments, a space divided reactor is utilized. In some embodiments, a high-volume manufacturing-capable single wafer atomic layer deposition reactor is used. In other embodiments, a batch reactor comprising multiple substrates is used.

In some embodiments, if necessary, the exposed surfaces of the workpiece can be pretreated to provide reactive sites to react with the first phase of the ALE process. In some embodiments, a separate pretreatment step is not required. In some embodiments the substrate is pretreated to provide a desired surface termination. In some embodiments the substrate is pretreated with plasma.

In some embodiments a plasma reactant is utilized. For example, in some embodiments a second phase comprises a plasma step for surface modification or for assisting in removing material from the substrate. In some embodiments, the etch cycle comprises a first phase comprising exposing the substrate to an etch reactant such as an N-substituted derivative of amine reactant as described herein and a second phase comprising exposing the substrate to a plasma. In some embodiments, a further extra phase can be added such as oxidation step or reduction step or halidization step, for example as described herein. In some embodiments, the plasma step comprises exposing the substrate to species from a plasma generated in a gas comprising one or more of argon, hydrogen, nitrogen, helium etc.

In some embodiments, an etch process includes a phase comprising a reduction step I which the substrate is exposed to a reducing agent, for example a phase comprising exposing the substrate to a reducing agent comprising $\beta$-diketonates, hydrogen, ammonia, hydrogen plasma or hydrogen-nitrogen plasma.

The reactants, such as a first etch reactant and any additional reactants (in some embodiments), are supplied to the reaction space in gaseous form. The reactants are considered "volatile" for purposes of the present description if the species exhibits sufficient vapor pressure under the process conditions to transport the species to the workpiece in sufficient concentration to saturate exposed surfaces.

As mentioned above, some etch processes include one or more phases in addition to the phase in which the substrate is exposed to the etch reactant, such as phases in which a second (or third) reactant is utilized, such as a halide, oxidant, plasma and/or reducing agent. Typically each reactant is pulsed into the reaction chamber containing the substrate with the surface to be etched for about 0.01 to about 60 seconds, about 0.05 to about 30 seconds, about 0.05 seconds to about 5.0 seconds, about 0.1 seconds to about 3 seconds or about 0.2 seconds to about 1.0 seconds. In some embodiments, the reactant contacts the substrate surface to be etched for about 0.05 seconds to about 5.0 seconds, about 0.1 seconds to about 3 seconds or about 0.2 seconds to about 1.0 seconds. In some embodiments, the pulse may be greater than about 60 seconds. However, depending on the reactor type, material being etched and other process conditions, such as surface area and temperature, the reactant contacting time may be even higher than about 10 seconds. In some embodiments, contacting times can be on the order of minutes. The optimum contacting time can be readily determined by the skilled artisan based on the particular circumstances.

In some embodiments an additional reactant reacts with the substrate surface to form a surface that may be etched by the etch reactant. In some embodiments an additional reactant reacts with a previously formed species to form vapor phase reaction by-products that include atoms of the material being etched. In some embodiments an additional reactant may serve both to form a surface that is susceptible to etching by an etch reactant and also to form volatile species including atoms of the surface to be etched. Excess additional reactant and the vapor phase reaction by-products may be removed from the vicinity of the substrate, such as by removing them from the reaction chamber. In some embodiments, removing excess reactant and reaction byproducts may comprise purging the reaction chamber. In some embodiments, the reaction chamber may be purged by stopping the flow of the second reactant while continuing to flow a carrier gas or purge gas for a sufficient time to diffuse or purge excess reactants and reactant by-products, from the reaction space. In some embodiments, the excess second reactant and reaction by-products are purged with the aid of inert gas, such as helium or argon. The purge gas may be provided in a pulse. The pulse of purge gas may, in some embodiments, be from about 0.1 seconds to about 10 seconds, about 0.1 seconds to about 4 seconds or about 0.1 seconds to about 0.5 seconds. In some embodiments, the substrate may be moved from the reaction space containing the second reactant to a different reaction space.

Reactants can be pulsed into the reaction chamber and contacted with the substrate for an appropriate amount of time. In some embodiments, an etch reactant, such as an N-substituted derivative of amine reactant, for example a bis(trialkylsilyl)amine reactant, is pulsed into the reaction chamber containing the substrate with the surface to be etched for about 0.01 to about 60 seconds, about 0.05 to about 30 seconds, about 0.05 seconds to about 5.0 seconds, about 0.1 seconds to about 3 seconds or about 0.2 seconds to about 1.0 seconds. In some embodiments, the pulse time may be greater than 60 seconds, for example up to 120 seconds or more. In some embodiments, the reactant contacts the substrate surface to be etched for about 0.01 to about 60 seconds, about 0.05 to about 30 seconds, about 0.05 seconds to about 5.0 seconds, about 0.1 seconds to about 3 seconds or about 0.2 seconds to about 1.0 seconds. In some embodiments, the pulse time may be greater than 60 seconds, for example up to 120 seconds. The optimum time can be determined by the skilled artisan based on the particular circumstances.

In some embodiments, excess reactant and/or reaction by-products are removed for about 0.01 to about 60 seconds, 0.05 to about 30 seconds, about 0.1 seconds to about 10 seconds, about 0.3 seconds to about 5 seconds or about 0.3 seconds to about 1 second. In some embodiments, it may be 60 seconds or more.

As mentioned above, after sufficient time for each reactant to react with the substrate surface, excess reactant and reaction byproducts, including atoms of the material to be etched, are removed from the substrate surface. In some embodiments, removing excess reactant and reaction byproducts may comprise purging the reaction chamber. In some embodiments, the reaction chamber may be purged by stopping the flow of the reactant while continuing to flow a carrier gas or purge gas for a sufficient time to diffuse or purge excess reactants and reactant by-products, if any, from the reaction space.

In some embodiments, the excess reactant and reaction by-products, if any, are purged with the aid of inert gas, such as nitrogen, helium or argon. In some embodiments the purge gas may be flowing throughout the ALE cycle. In some embodiments, the substrate may be moved from the reaction space containing the reactant to a second, different reaction space. In some embodiments, the reactant is removed for about 0.01 to about 60 seconds, 0.05 to about 30 seconds, about 0.1 seconds to about 10 seconds, about 0.3 seconds to about 5 seconds or about 0.3 seconds to about 1 second. In some embodiments, it may be 60 seconds or more.

According to some embodiments, ALE cycles may be performed at temperatures ranging from about 20 to about 1200° C., about 50 to about 800° C., about 75 to about 600° C., about 300° C. to about 500° C., or from about 350° C. to about 450° C. In some embodiments, the temperature is greater than about 20, 50 or 100° C., but less than about 1000, 800, 600 or 500° C. In some embodiments, the cycles are carried out at a temperature of about 450° C.

The pressure in the reaction chamber is typically from about 10 E-9 torr to about 760 torr, or about 0.001 to about 100 torr. However, in some cases, the pressure will be higher or lower than this range, as can be determined by the skilled artisan given the particular circumstances. In some embodiments, a pressure of less than 2 torr is utilized. In some cases the reactor can be operated either in isothermal (such as hot-wall) or non-isothermal (such as cold-wall) conditions. In some embodiments the reactor itself does not interact with etching chemistries and may also not interact with substrates. In some cases reactor can comprise a hot-wall, cold-wall or warm-wall type of reaction chamber.

The substrate comprising a material to be etched, also referred to as target material, can take a variety of forms. In some embodiments, the substrate may be an integrated circuit workpiece or other substrate. The target material to be etched may comprise a thin film on the substrate surface. In some embodiments, the target material is a thin film on or forming a three-dimensional structure on a substrate. The substrate comprising a thin film or other material to be etched may comprise various types of other materials. For example, in some embodiments the substrate may comprise silicon in addition to a material that is targeted by the etching process. In some embodiments, the etch process is selective for the target material relative to other materials on the substrate or in the reaction chamber.

In some embodiments, the target material to be etched comprises a metal, metal oxide or metal nitride. In some embodiments, the target material to be etched comprises a metal, such as Co, Ni, Cu, Al, Fe, Mn or Cr. In some embodiments the target material to be etched comprises a metal such as Sc, Y, Ti, V, Cr, Mn, Co, Cu, Ni, Fe, Zn, La, Ce, Gd, Yb, Mo, Ta or Hf. In some embodiments, the material to be etched comprises metal nitride or metal oxide or mixtures thereof.

In some embodiments, the ALE process has an average etch rate of about 0.01 to about 5 Å/cycle. Etch rate is defined as amount of material or thickness of film is removed after each cycle. For practical reasons etch rate can be calculated after 1 etching cycle, after more than 2 etching cycles or more than 5 or even higher than 20 or sometimes higher than 50 cycles. In some embodiments, the average etch rate is about 0.01 to 0.1 Å/cycle or from 0.1 to about 2 Å/cycle or in some cases even higher than 2 Å/cycle. In some embodiments, the average etch rate is more than about 0.1 Å/cycle, more than about 0.5 Å/cycle, more than about 1.0 Å/cycle, more than about 2.0 Å/cycle, more than about 3.0 Å/cycle, more than about 5.0 Å/cycle, more than about 10 Å/cycle or more than about 20 Å/cycle and in some instances if continuous flow is applied with flow rate modification or the exposure times are long enough the etch rates can be more than about 30 Å/cycle, more than about 50 Å/cycle or more than about 100 Å/cycle.

In some embodiments the etch selectivity i.e. the ratio of target material (thickness, mass or amount of atoms/molecules) removed from the desired surface/material to material removed from the non-desired surface/materials or surfaces/materials, is from more than about 2:1, more than about 3:1, more than about 5:1, more than about 7:1, more than about 10:1, more than about 15:1, more than about 20:1, more than about 30:1, more than about 50:1, more than about 100:1, more than about 1000:1. In some embodiments no substantial amount of material is removed from the non-desired surface/material.

An exemplary metal oxide etch process is illustrated in FIG. 1, in which a substrate comprising a metal oxide surface 110 to be etched is provided. In the illustrated embodiment, the metal oxide surface 110 is over a metal layer 100. In some embodiments the metal of the metal 100 and/or metal oxide 110 may be, for example, Co, Ni, Cu, Fe, Mn or Cr. In some embodiments the metal of the metal surface 100 and/or metal oxide surface 110 may comprise, for example, Sc, Y, Ti, V, Cr, Mn, Co, Cu, Ni, Fe, Zn, La, Ce, Gd, Yb, Mo, Ta or Hf. The metal oxide surface 110 is contacted with an etch reactant, such as a reactant comprising an N-substituted derivative of amine, for example a bis(trialkylsilyl)amine reactant, forming volatile reaction byproducts, such as volatile $M(N(SiME_3)_2)_x$ species comprising atoms from the metal oxide such that the metal oxide is removed from the metal surface. The volatile reaction byproducts are removed from the vicinity of the substrate. In some embodiments one or more etch cycles comprising contacting the substrate with the etch reactant and removing reaction byproducts may be carried out to remove some or all of the metal oxide.

Figure 2:
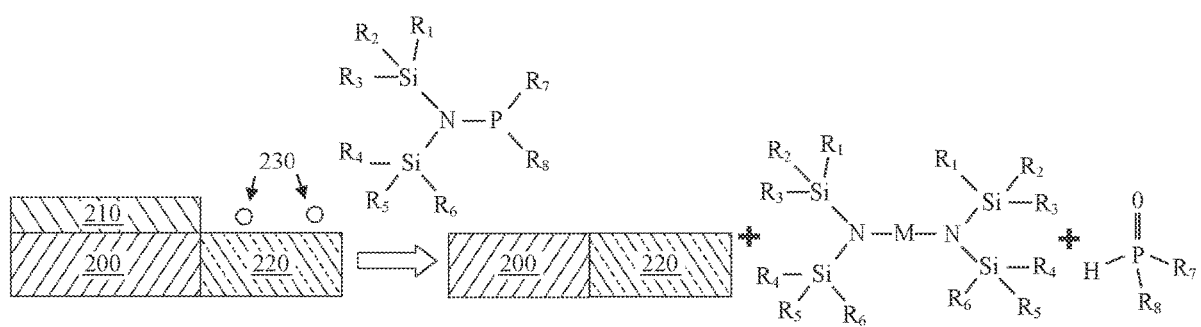
FIG. 2 is a schematic diagram of a process for cleaning the surface of a substrate by etching metal oxide and parasitic materials from a metal layer and a low-k layer respectively.

Another exemplary reaction is illustrated in FIG. 2, in which a substrate surface is cleaned by etching. As illustrated, a substrate comprising both a metal layer 200 and a low-k layer 220 is provided. As illustrated, the surface of the metal layer 200 is covered with a metal oxide layer 210, while the surface of the low-k layer 220 comprises parasitic material 230. In some embodiments the metal of the metal layer 200 and/or metal oxide layer 210 may be, for example, Co, Ni, Cu, Fe, Mn or Cr. In some embodiments the metal of the metal layer 200 and/or metal oxide layer 210 may comprise, for example, Sc, Y, Ti, V, Cr, Mn, Co, Cu, Ni, Fe, Zn, La, Ce, Gd, Yb, Mo, Ta or Hf. Metal oxide may be etched from the surface of the metal layer 200 and parasitic material 230 etched from the surface of the low-k layer by exposure to an etch reactant, such as an N-substituted derivative of amine, for example a bis(trialkylsilyl)amine reactant. Volatile reaction byproducts, such as volatile $M(N(SiME_3)_2)_x$ species are removed from the reaction space after exposure to the etch reactant. In some embodiments one or more etch cycles comprising contacting the substrate with the etch reactant and removing reaction byproducts may be carried out to remove all of the metal oxide 210 and parasitic material 230.

Figure 3:
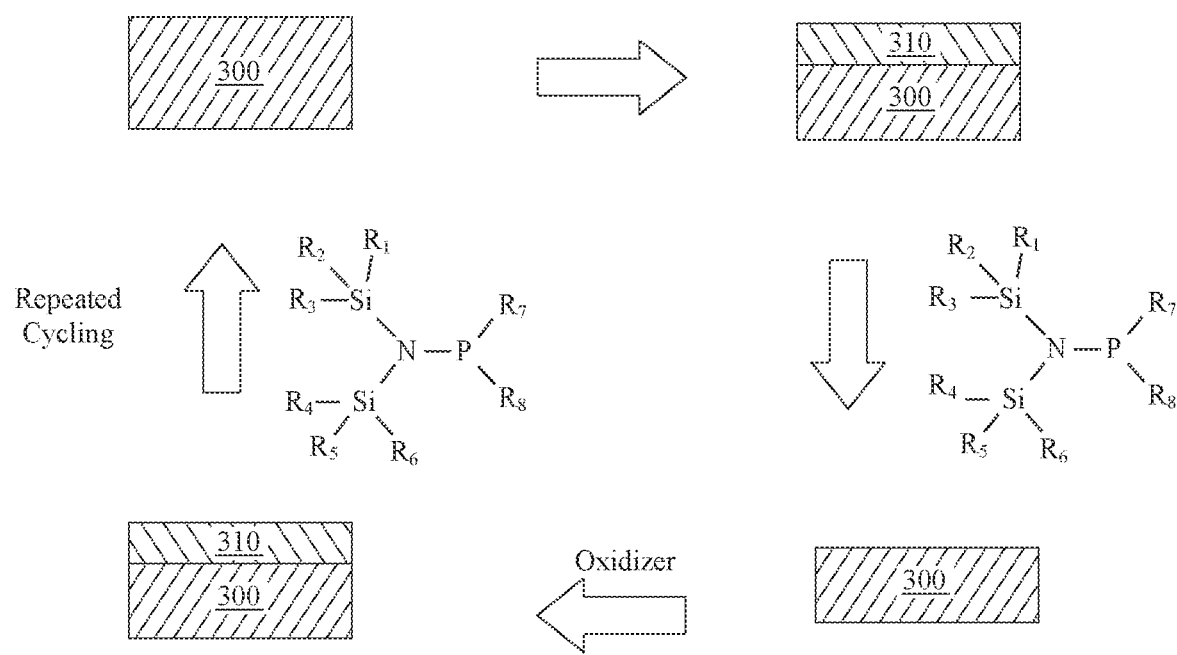
FIG. 3 is a schematic diagram of an atomic layer etching process in which a metal layer on a substrate is etched by alternate and sequential exposure to an oxidizing agent and an etch reactant.

An etching process utilizing two phases is illustrated in FIG. 3. In the process illustrated in FIG. 3, an oxidizing phase is utilized in combination with an etch phase. In the oxidation phase a substrate comprising a metal layer 300 is exposed to an oxidant (also referred to as an oxidizer) to form a metal oxide surface 310 on the metal layer 300. The oxidant may comprise, for example, $O_3$, $O_2$, $H_2O$, $H_2O_2$, $SO_3$, or excited oxygen species, such as from $O_2/O_3$ plasma. Excess oxidant is removed from the substrate surface, such as by purging the reaction space. The substrate is then contacted with an etch reactant, such as an N-substituted derivative of amine reactant, which reacts with the metal oxide surface 310 to form volatile species, such as $M(N(SiMe_3)_2)_x$ species, comprising atoms from the metal oxide 310. Volatile species are removed from the substrate surface, such as by purging the reaction space. In this way, metal is etched from the metal layer 300 in each cycle. The cycle may be repeated, oxidizing the etched metal layer 300 again and subsequently exposing to the etch reactant, until a desired amount of etching of the metal layer 300 has been achieved.

As mentioned above, in another etching process utilizing two phases a substrate comprising a surface to be etched is subjected to a first phase comprising halidization of the surface to be etched and a second phase in which the halidized surface is etched. That is, in a first phase a substrate comprising a surface to be etched, such as a metal, metal oxide or metal nitride surface, is exposed to a halide reactant to form a halidized surface. The halide reactant may be as described above. Excess halide reactant and reaction byproducts are removed from the area of the substrate surface, such as by purging the reaction space comprising the substrate. In a second phase the substrate is contacted with an etchant reactant, such as an etch reactant comprising any N-substituted derivative of amine as described herein. The etchant reacts with the halidized surface to form volatile species that include atoms of the surface to be etched. Volatile species are removed along with excess etchant. In this way material is removed from the surface to be etched in each cycle. The two phases may be repeated multiple times to achieve the desired amount of etching. In some embodiments an oxidant may also be used in a third phase in combination with a halide and an etchant.

In an exemplary embodiment, a metal oxide surface may be etched by contacting the metal oxide with a metal halide in a first phase. A metal halide surface is formed along with volatile metal oxide. The volatile species may be removed from the reaction space. In a second phase an etch reactant, for example comprising any N-substituted derivative of amine such as HMDS is provided that reacts with the metal halide surface to form volatile $M(N(SiMe_3)_2)_x$ species that are then removed from the reaction space. If the surface to be etched is a metal, an initial phase may be utilized in which the metal surface is contacted with an oxidant to form metal oxide.

As mentioned above, in another etching process utilizing two phases a substrate comprising a surface to be etched is subjected to a first phase comprising plasma treatment of the surface to be etched and a second phase in which the plasma-treated surface is etched. That is, in a first phase a substrate comprising a surface to be etched, such as a metal, metal oxide or metal nitride surface, is exposed to a plasma reactant to form a plasma-treated surface. The plasma reactant may be as described above. Excess plasma reactant and reaction byproducts are removed from the area of the substrate surface, such as by purging the reaction space comprising the substrate. In a second phase the substrate is contacted with an etchant reactant, such as an etch reactant comprising any N-substituted derivative of amine as described herein. The etchant reacts with the plasma-treated surface to form volatile species that include atoms of the surface to be etched. Volatile species are removed along with excess etchant. In this way material is removed from the surface to be etched in each cycle. The two phases may be repeated multiple times to achieve the desired amount of etching. In some embodiments an oxidant may also be used in a third phase in combination with a plasma and an etchant.

It will be appreciated by those skilled in the art that various modifications and changes can be made without departing from the scope of the invention. Similar other modifications and changes are intended to fall within the scope of the invention, as defined by the appended claims.

What is claimed is:

1. A method of etching a metal, metal oxide or metal nitride on a substrate surface by chemical atomic layer etching in a reaction space, the method comprising one or more etching cycles, each cycle comprising:
  contacting the substrate surface with an etch reactant comprising a vapor-phase N-substituted derivative of an amine compound; and
  removing excess etch reactant and reaction by-products from the reaction space,
  wherein the N-substituted derivative of an amine compound has the formula:

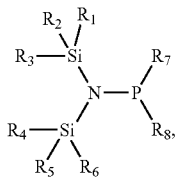

wherein each R1-R6 independently is any alkyl group and each R7 and R8 independently is any of H, methyl, ethyl, isopropyl, n-propyl, tert-butyl, sec-butyl, n-butyl, any isomer of pentyl, any isomer of hexyl, phenyl and fluoro.

2. The method of claim 1, wherein the metal, metal oxide or metal nitride comprises a metal selected from Co, Ni, Cu, Fe, Mn, Ti, Ta, Hf, Zn, La, Sc, Mo and Cr.

3. The method of claim 1, wherein the etch cycle is part of a cyclic vapor deposition process.

4. The method of claim 1, wherein the etch cycle is repeated two or more times in a row.

5. The method of claim 1, wherein the substrate is a semiconductor substrate.

6. The method of claim 1, additionally comprising contacting the substrate surface with a vapor-phase second reactant selected from a halide, an oxidant and a plasma reactant.

7. The method of claim 6, wherein the substrate surface is contacted with the vapor-phase second reactant after being contacted with the etch reactant.

8. The method of claim 1, wherein the etch cycle comprises:
  contacting a metal or metal nitride on the substrate surface with an oxidant to form metal oxide on the substrate surface;
  contacting the metal oxide on the substrate surface with the vapor-phase etch reactant comprising an N-substituted derivative of amine compound; and
  removing excess etch reactant and reaction by-products from the reaction space.

9. The method of claim 8, wherein the oxidant comprises $O_3$, $O_2$, $H_2O$, $H_2O_2$, $SO_3$, or excited oxygen species.

10. The method of claim 1, wherein the etch cycle comprises contacting the substrate surface with a plasma to form a plasma-modified surface prior to contacting the substrate surface with the etch reactant.

11. The method of claim 10, wherein the plasma comprises a plasma generated in a gas comprising hydrogen, nitrogen, a nitrogen-hydrogen mixture, argon, or helium.

12. The method of claim 1, wherein the etch cycle comprises:
  contacting the metal, metal oxide or metal nitride on the substrate surface with a vapor-phase halide reactant to form a halidized surface;
  contacting the halidized surface with a vapor-phase etch reactant comprising an N-substituted derivative of amine compound; and
  removing excess etch reactant and reaction by-products from the reaction space.

13. The method of claim 12, wherein prior to contacting the substrate surface with the vapor-phase halide reactant the substrate surface comprises a metal or metal nitride and the metal or metal nitride is contacted with an oxidant to form a metal oxide.

14. The method of claim 12, wherein the halide reactant comprises a metal halide, a non-metal halide, an organic halide, or an interhalogen.

* * * * *